United States Patent
Lee

(10) Patent No.: US 7,247,412 B2
(45) Date of Patent: Jul. 24, 2007

(54) METHOD OF CORRECTING DEVIATIONS OF CRITICAL DIMENSIONS OF PATTERNS FORMED ON A WAFER IN A EUVL PROCESS

(75) Inventor: Myoung-Soo Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 15 days.

(21) Appl. No.: 11/319,245

(22) Filed: Dec. 27, 2005

(65) Prior Publication Data

US 2006/0147818 A1    Jul. 6, 2006

(30) Foreign Application Priority Data

Jan. 4, 2005    (KR) .................... 10-2005-0000591

(51) Int. Cl.
*G03C 5/00*    (2006.01)
*G03F 9/00*    (2006.01)

(52) U.S. Cl. .................... 430/30; 430/5; 430/296; 430/328; 430/942

(58) Field of Classification Search .................... 430/5, 430/30, 296, 328, 942
See application file for complete search history.

(56) References Cited

U.S. PATENT DOCUMENTS 5,052,033 A    9/1991    Ikeda et al.

FOREIGN PATENT DOCUMENTS

| JP | 07-191450 | 7/1995 |
|---|---|---|
| KR | 2001-0077719 | 8/2001 |
| KR | 2002-0058445 | 7/2002 |

OTHER PUBLICATIONS

English language abstract of Korean Publication No. 2001-0077719.
English language abstract of Korean Publication No. 2002-0058445.
English language abstract of Japanese Publication No. 07-191450.

*Primary Examiner*—Christopher G. Young
(74) *Attorney, Agent, or Firm*—Marger Johnson & McCollom, P.C.

(57) ABSTRACT

An embodiment includes a method of correcting deviations of critical dimensions of patterns formed on a wafer in an extreme ultraviolet lithography (EUVL) process. The embodiment includes preparing a reflection photo mask having a reflection layer and absorption patterns that are formed on the reflection layer to define reflection regions therebetween. An exposure process is performed using the reflection photo mask, thereby forming the patterns on the wafer. Critical dimensions of the patterns are measured. A reference critical dimension is set based on the measured critical dimensions of the patterns. Critical dimension deviations are determined by comparing the measured critical dimensions of the patterns with the reference critical dimension. Energy beams having energies corresponding to the critical dimension deviations are locally irradiated onto the reflection layer, thus locally varying the thickness of the reflection layer.

22 Claims, 3 Drawing Sheets

METHOD OF CORRECTING DEVIATIONS OF CRITICAL DIMENSIONS OF PATTERNS FORMED ON A WAFER IN A EUVL PROCESS

This application claims the benefit of Korean Patent Application No. 10-2005-591, filed Jan. 4, 2005, the disclosure of which is hereby incorporated herein by reference in its entirety.

BACKGROUND OF THE INVENTION

1. Field of the Invention

The present invention relates to an extreme ultraviolet lithography (EUVL) process, and more particularly, to a method of correcting deviations of critical dimensions of patterns formed on a wafer during an EUVL process.

2. Description of Related Art

In the fabrication of semiconductor devices, as the design rule is reduced to increase integration density, a lithography process for obtaining higher resolution is required. By a deep ultraviolet lithography (DUVL) process, a pattern having a dimension of about 250 nm can be formed using a 248-nm KrF laser as a light source. Also, when a 193-nm ArF laser is used as a light source, a pattern having a dimension of about 100 to 130 nm can be formed. However, the above-described DUVL process has a technical limitation in obtaining sub-100-nm resolution. For this reason, there have been intensive studies on an EUVL process that makes use of extreme ultraviolet rays (which are called soft X-rays) as a light source.

The EUVL process is notably different from the DUVL process in that the extreme ultraviolet rays used as a light source have a wavelength of 13.4 nm in which most materials have high light-absorbing properties. Accordingly, unlike in the DUVL process, a transmission photo mask cannot be used. Instead, a reflection photo mask should be used in the EUVL process. As disclosed in U.S. Pat. No. 5,052,033, the reflection photo mask basically includes a mask substrate, a reflection layer disposed on the mask substrate, and absorption patterns disposed on the reflection layer.

Meanwhile, in a lithography process, the uniformity of critical dimensions of patterns formed on a wafer is degraded with a reduction in the design rule. That is, when the patterns that are designed in the same dimension are transferred onto the wafer through the same photo mask, the dimensions of the patterns are undesirably changed during an exposure process depending on the positions to where the patterns are transferred. With recent reductions in the design rule, the change in the dimensions of the patterns is getting more serious. The uniformity of critical dimensions of the patterns formed on the wafer is affected by a variety of factors, such as a photoresist coating process, a baking process, an exposure apparatus, a photo mask, a developing process, and an etching process. In particular, shot uniformity, which refers to a dimension or a difference between the dimensions measured on a wafer after an exposure process, considerably depends on an exposure apparatus and a photo mask.

Nowadays, the DUVL process makes several attempts to improve the uniformity of critical dimensions of patterns formed on a wafer. Specifically, a diffraction grating or filter is provided on a rear surface of a photo mask to account for a change in the illumination system used for an exposure process. Alternatively, a method of preparing a filter on a photo mask to vary the energy of a laser pulse used as an exposure source is employed. However, these methods are applicable to the DUVL process that makes use of the transmission photo mask, but cannot be applied to the EUVL process that makes use of the reflection photo mask. Therefore, it is necessary to develop a new method for improving the uniformity of critical dimensions of patterns formed on a wafer, and to increase the yield of the reflection photo mask, which is more expensive than the transmission photo mask, during the EUVL process.

SUMMARY

Embodiments of the invention provide a method of correcting deviations of critical dimensions of patterns formed on a wafer in an extreme ultraviolet lithography (EUVL) process. These method embodiments can increase the yields of a reflection photo mask and the wafer that are used in the EUVL process.

In one aspect, the invention is directed to a method of correcting deviations of critical dimensions of patterns formed on a wafer in an EUVL process. The method includes preparing a reflection photo mask having a reflection layer. An energy beam is locally irradiated onto the reflection layer to locally vary the thickness of the reflection layer.

The local variation in the thickness of the reflection layer may include locally reducing the thickness of the reflection layer. Also, the local reduction in the thickness of the reflection layer may include locally lowering the reflectance of the reflection layer.

The energy beam may be an electron beam, an ion beam, or an electromagnetic beam. Preferably, the energy beam may be a focused electron beam.

The reflection layer may be a multiple layer obtained by alternately laminating two different kinds of layers. In this case, the reflection layer may be a multiple layer obtained by alternately laminating a molybdenum layer and a silicon layer.

The reflection photo mask may include a mask substrate on which the reflection layer is formed, and absorption patterns disposed on the reflection layer. Further, the reflection photo mask may include a capping layer interposed between the absorption patterns and the reflection layer, and a buffer layer interposed between the capping layer and the absorption patterns.

In another aspect, the present invention is directed to a method of correcting deviations of critical dimensions of patterns formed on a wafer in an EUVL process. The method includes preparing a reflection photo mask having a reflection layer and absorption patterns that are formed on the reflection layer to define reflection regions therebetween. An exposure process is performed using the reflection photo mask, thereby forming the patterns on the wafer. Critical dimensions of the patterns are measured. A reference critical dimension is set based on the measured critical dimensions of the patterns. The critical dimensions of the patterns are compared with the reference critical dimension, thereby determining critical dimension deviations. Energy beams having energies corresponding to the critical dimension deviations are locally irradiated onto the reflection layer so that the thickness of the reflection layer is locally varied.

The local variation in the thickness of the reflection layer may include locally reducing the thickness of the reflection layer. Also, the local reduction in the thickness of the reflection layer may include locally lowering the reflectance of the reflection layer.

When the critical dimensions of the patterns are critical dimensions of clear patterns transferred from the reflection regions, the reference critical dimension may be set to a minimum of the critical dimensions of the patterns. In another case, when the critical dimensions of the patterns are critical dimensions of dark patterns transferred from the absorption patterns, the reference critical dimension may be set to a maximum of the critical dimensions of the patterns.

The energy beams may be electron beams, ion beams, or electromagnetic beams. Preferably, the energy beams may be focused electron beams.

The reflection layer may be a multiple layer obtained by laminating two different kinds of layers alternately. In this case, the reflection layer may be a multiple layer obtained by laminating a molybdenum layer and a silicon layer alternately.

The reflection photo mask may further include a capping layer interposed between the absorption patterns and the reflection layer, and a buffer layer interposed between the capping layer and the absorption patterns.

BRIEF DESCRIPTION OF THE DRAWINGS

The foregoing and other objects, features and advantages of the invention will be apparent from the more particular description of a preferred embodiment of the invention, as illustrated in the accompanying drawings. The drawings are not necessarily to scale, with emphasis instead being placed upon illustrating the principles of the invention.

DETAILED DESCRIPTION

Figure 1:
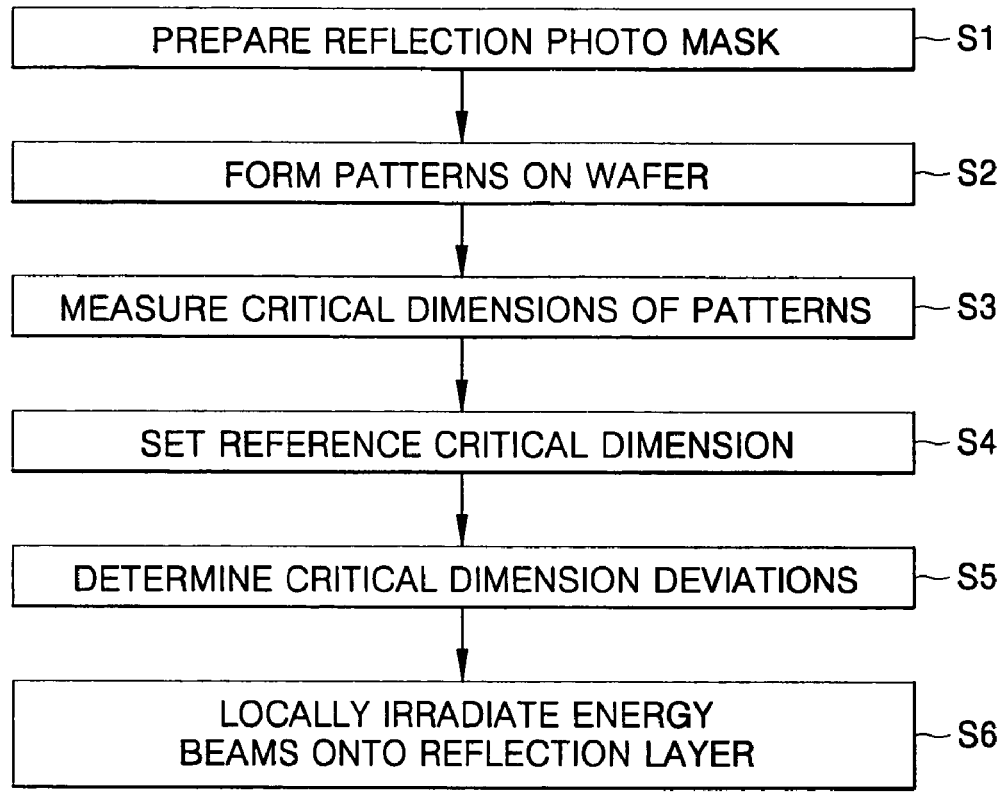
FIG. 1 is a flowchart illustrating a method of correcting deviations of critical dimensions of patterns formed on a wafer, according to an exemplary embodiment of the present invention.

Embodiments of the present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete, and fully conveys the scope of the invention to those skilled in the art. In the drawings, the thicknesses of layers and regions may be exaggerated for clarity. The same reference numerals are used to denote the same elements.

Figure 2:
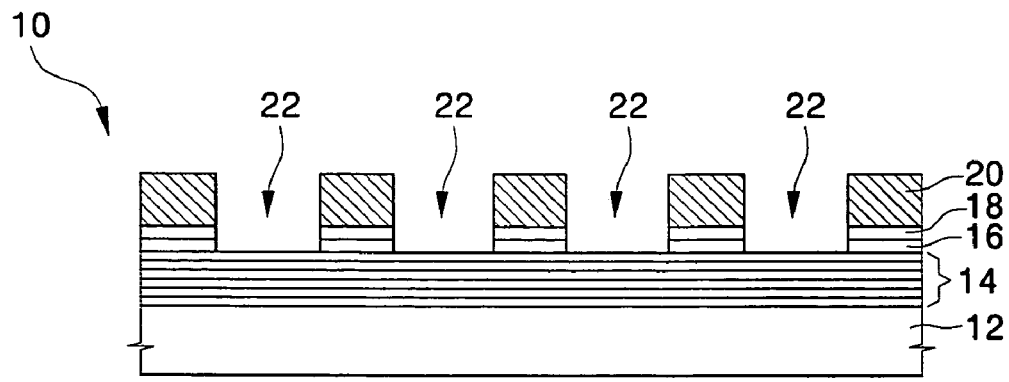
FIG. 2 is a cross-sectional view of a reflection photo mask used in the method shown in FIG. 1.

FIG. 1 is a flowchart illustrating a method of correcting deviations of critical dimensions of patterns formed on a wafer, according to an exemplary embodiment of the present invention, and FIG. 2 is a cross-sectional view of a reflection photo mask 10 used in the method shown in FIG. 1.

Referring to FIGS. 1 and 2, the reflection photo mask 10 is prepared (S1). Extreme ultraviolet rays used for an extreme ultraviolet lithography (EUVL) process have a wavelength of 13.4 nm at which most materials have high light-absorbing properties. Thus, as shown in FIG. 2, the reflection photo mask 10 used for the EUVL process includes a reflection layer 14 disposed on a mask substrate 12 to reflect incident light during an exposure process. The mask substrate 12 may be a silicon substrate or a quartz substrate, for example. The reflection layer 14 may be, for example, a multi-layer that is obtained by alternately laminating two different kinds of layers. For example, the reflection layer 14 may be a multi-layer that is formed by laminating a silicon layer and a molybdenum layer alternately. In this case, the reflection layer 14 may include about 40 to 60 bilayers, each being formed of the silicon layer and the molybdenum layer. Also, the silicon layer and the molybdenum layer of the reflection layer 14 may be about 3 and 4 nm in thickness, respectively. Absorption patterns 20 are formed on the reflection layer 14 to absorb the extreme ultraviolet rays. Regions of the reflection layer 14, which are exposed by the absorption patterns 20, are defined as reflection regions 22. The absorption patterns 20 may have a thickness of about 200 nm and be formed of a TaN, Ta, TiN, or Ti layer. A capping layer 16 may be interposed between the absorption patterns 20 and the reflection layer 14. Further, a buffer layer 18 may be interposed between the capping layer 16 and the absorption patterns 20. The buffer layer 18 may be formed of a silicon oxide layer or a silicon oxynitride layer. Also, the capping layer 16 may be formed of a material (e.g., chrome) having an etch selectivity with respect to the buffer layer 18.

The reflection photo mask 10 can be formed by the following process. First, the reflection layer 14, a capping material layer, a buffer material layer, and an absorption layer are sequentially formed on the mask substrate 12. Subsequently, the absorption layer is patterned using a photolithography process and an anisotropic dry etching process, thereby forming the absorption patterns 20. In this process, the capping material layer and the buffer material layer serve to prevent the surface of the reflection layer 14 from being damaged during the etching process. Meanwhile, the absorption patterns 20 may be formed in a direct-write fashion using laser or electron beams. Thereafter, portions of the capping material layer and the buffer material layer, which are exposed by the absorption patterns 20, are wet etched, thereby forming the capping layer 16 and the buffer layer 18.

Next, an exposure process is carried out using the reflection photo mask, thereby forming patterns on the wafer (S2).

Hereinafter, a process of forming the patterns on the wafer will be described with reference to FIG. 3.

Figure 3:
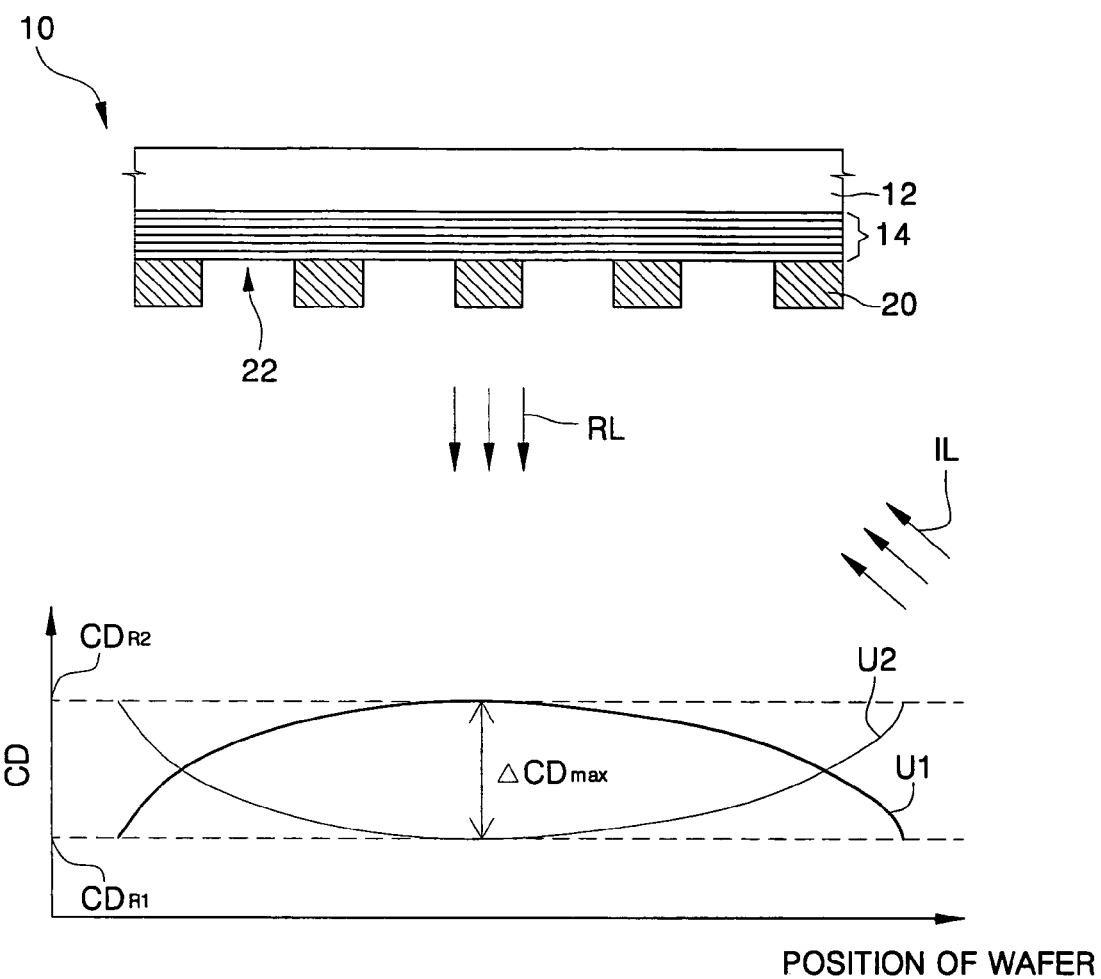
FIG. 3 is a cross-sectional view of a reflection photo mask and a graph illustrating an exposure process using a reflection photo mask and deviations of critical dimensions of patterns formed on a wafer.

FIG. 3 is a cross-sectional view of a reflection photo mask and a graph illustrating an exposure process using a reflection photo mask. Note that, in FIG. 3, the relative position of the reflection photo mask and the wafer depicted in the figure is only a schematic representation; the curves in the graph are only an example, and should not be construed to be a necessary condition for the relative position or character of the reflection photo mask shown.

Referring to FIG. 3, the reflection photo mask 10 is loaded along with the wafer into EUVL exposure equipment. An underlying layer and a photoresist layer, which are to be patterned, are formed on the wafer. Incident light 'IL' is irradiated from a light source (not shown) onto the reflection photo mask 10. The incident light 'IL' irradiated onto the reflection photo mask 10 is absorbed in the absorption patterns 20, and reflected light 'RL' reflected from the reflection regions 22 is irradiated onto the wafer. As a result, the patterns formed on the reflection photo mask 10 are transferred onto the photoresist layer of the wafer. Subsequently, patterns are formed on the wafer by a developing process. In this case, the patterns formed on the wafer may include clear patterns transferred from the reflection regions 22 and dark patterns transferred from the absorption patterns 20. For instance, when the photoresist layer formed on the wafer has a positive property, the dark patterns may correspond to photoresist patterns that remain on the wafer after the developing process, and the clear patterns may correspond to spaces between the photoresist patterns.

Referring to FIGS. 1 and 3, after the patterns are formed on the wafer, the critical dimensions of the patterns formed on the wafer are measured (S3). The critical dimensions may be manually or automatically measured using a scanning electron microscope (SEM). By the exposure and developing processes, there is a strong likelihood that the patterns formed on the wafer will be uniform in critical dimension. However, critical dimensions of patterns formed on an actual wafer may vary according to its position. In other words, as deviations of the critical dimensions of the patterns increase, shot uniformity of the critical dimensions may greatly decrease. As for the EUVL process using the reflection photo mask 10, the deviations of critical dimensions are large mainly because the reflectance of the reflection layer 14 varies with position of the reflection regions 22 of the reflection photo mask 10, that is, the portions exposed by the absorption patterns 20. In this case, the clear patterns that are transferred from the reflection regions 22 having high reflectances may have large critical dimensions, while the clear patterns that are transferred from the reflection regions 22 having low reflectances may have small critical dimensions. Inversely, the dark patterns that are transferred from the absorption patterns 20 disposed between the reflection regions 22 having high reflectance may have small critical dimensions, while the dark patterns that are transferred from the absorption patterns 20 disposed between the reflection regions 22 having low reflectance may have large critical dimensions. The reason the reflectance of the reflection layer 14 varies with position is that the refection layer 14 may have defects or different thicknesses depending on position during the formation of the reflection layer 14.

For example, as shown in FIG. 3, when the critical dimensions of the clear patterns are shown as a curve 'U1' according to the position on the wafer, the critical dimensions of the dark patterns can be shown as a curve 'U2'.

After measuring the critical dimensions of the patterns formed on the wafer, a reference critical dimension is set based on the measured critical dimensions of the patterns (S4). As can be seen from FIG. 3, when the critical dimensions of the clear patterns are measured, the reference critical dimension may be set to a minimum critical dimension '$CD_{R1}$' of the measured critical dimensions. Inversely, when the critical dimensions of the dark patterns are measured, the reference critical dimension may be set to a maximum critical dimension '$CD_{R2}$' of the measured critical dimensions. That is, the reference critical dimension may correspond to the critical dimension of a pattern transferred from a region of the reflection layer 14 with the lowest reflectance.

After setting the reference critical dimension, the critical dimensions measured in S3 of FIG. 1 are compared with the reference critical dimension, so that differences between the reference critical dimension and the measured critical dimensions, i.e., critical dimension deviations ΔCD, are determined (S5). In this case, a maximum $\Delta CD_{max}$ of the critical dimension deviations ΔCD corresponds to a difference between the reference critical dimension and the critical dimension of a pattern transferred from a region of the reflection layer 14 with the highest reflectance.

After determining the critical dimension deviations ΔCD, energy beams having energies corresponding to the critical dimension deviations ΔCD are locally irradiated onto the reflection layer 14, to locally reduce the thickness of the reflection layer 14 (S6). As described above, the reflection layer 14 is a multiple layer that is obtained by alternately laminating a molybdenum layer and a silicon layer several tens of times. By reducing the thickness of the reflection layer 14, it is known that contrast at an interface between each pair of layers of the multiple layer decreases to lower reflectance. The present invention makes use of a reduction in reflectance from a reduction in the thickness of the reflection layer 14 so that the critical dimension deviations of the patterns formed on the wafer can be corrected. In other words, the energy beams having energies corresponding to the critical dimension deviations ΔCD are locally irradiated onto the reflection layer 14. Energies, which are locally accumulated in the reflection layer 14 due to the energy beams, thermally activate the respective layers of the reflection layer 14. As a result, diffusion occurs between the respective layers of the reflection layer 14, thus locally reducing the thickness of the reflection layers 14. Also, the portions of the reflection layer 14 that are locally reduced in thickness have lower reflectances. The energy beams may be any energy source that can thermally activate the reflection layer 14. For instance, the energy beams may be electromagnetic beams, electron beams, or ion beams. Preferably, the energy beams may be focused electron beams. In this case, the focused electron beams may be irradiated at a current of about 5 nA to 5 μA at an acceleration voltage of about 100 eV to 100 KeV with a beam diameter of about 100 nm to 1 cm for an exposure time of several tens of milliseconds.

Figure 4:
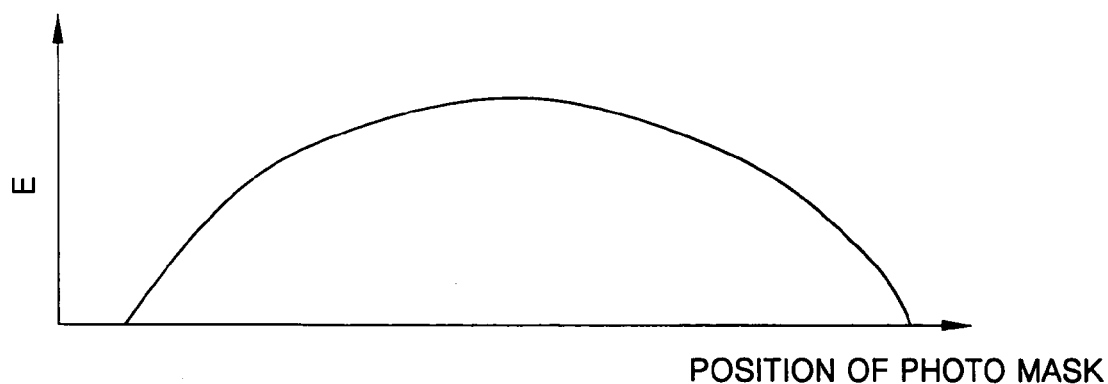
FIG. 4 is a graph showing intensity of an energy beam depending on the position of a reflection photo mask used in the method shown in FIG. 1.

FIG. 4 is a graph showing intensity of an energy beam depending on the position of a reflection photo mask used in the method shown in FIG. 1.

Referring to FIG. 4, when the critical dimensions of the patterns formed on the wafer are shown as the curves 'U1' and 'U2' of FIG. 3, the intensity E of an energy beam locally irradiated onto the reflection layer 14 may have the distribution shown in FIG. 4 to correct the critical dimension deviations ΔCD. This, and perhaps more, energy beams are irradiated at the greatest intensity onto a region of the reflection layer 14 corresponding to the pattern having the maximum critical dimension deviation $\Delta CD_{max}$. That is, the energy beams are irradiated onto the reflection layer 14 at various intensities that are proportional to the critical dimension deviations ΔCD. In other words, the critical dimension deviations ΔCD can be expressed as reflectance deviations depending on the position of the reflection layer 14, and a position of the wafer where a pattern having the reference critical dimension is formed can correspond to a position of the reflection layer 14 that has the lowest reflectance. By locally irradiating the energy beams onto the reflection layer 14 as described above, the reflectance deviations depending on the position of the reflection layer 14 are reduced. Preferably, the reflection layer 14 can have uniform reflectance throughout the entire region.

Figure 5:
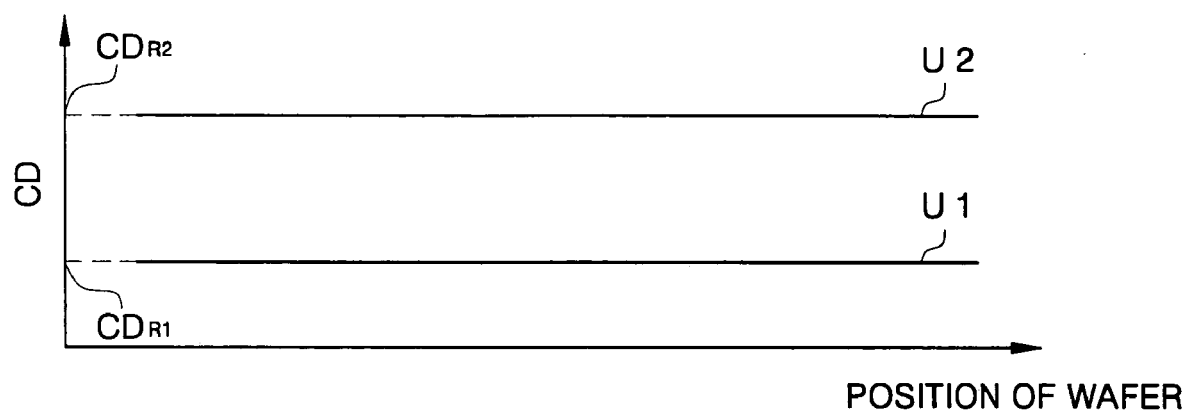
FIG. 5 is a graph showing deviations of critical dimensions of patterns formed on a wafer using a reflection photo mask having a reflectance that is corrected by the method shown in FIG. 1.

FIG. 5 is a graph showing deviations of critical dimensions of patterns formed on a wafer using a reflection photo mask having reflectance that is corrected by the method shown in FIG. 1.

Referring to FIG. 5, when an exposure process is carried out using the reflection photo mask having a reflectance that is corrected by partially irradiating energy beams as described above, reflected light, which is reflected by the reflection layer and irradiated onto the wafer, has a uniform dose over the entire wafer. As a result, as shown in FIG. 5, patterns formed on the wafer can have a uniform critical dimension without causing deviations that depend on the position of the wafer. In this case, the critical dimensions of the clear patterns may be corrected approximately to the minimum critical dimension $CD_{R1}$ as shown in a line 'U1" of FIG. 5, and the critical dimensions of the dark patterns may be corrected approximately to the maximum critical dimensions $CD_{R2}$ as shown in a line 'U2" of FIG. 5.

As described above, the present invention can uniformly control the reflectance of a reflection layer by locally irradiating energy beams onto the reflection layer of a reflection photo mask. As a consequence, deviations of critical dimensions of patterns formed on a wafer can be corrected, thus improving the uniformity of the critical dimensions. Also, the critical dimension deviations can be corrected without the need to form the reflection photo mask again, thus increasing the yields of the reflection photo mask and the wafer.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of correcting deviations of critical dimensions of patterns formed on a wafer in an extreme ultraviolet lithography process, the method comprising:
   preparing a reflection photo mask having a reflection layer; and
   locally varying the thickness of the reflection layer by locally irradiating an energy beam onto the reflection layer.

2. The method according to claim 1, wherein locally varying the thickness of the reflection layer includes locally reducing the thickness of the reflection layer.

3. The method according to claim 2, wherein locally reducing the thickness of the reflection layer includes locally lowering the reflectance of the reflection layer.

4. The method according to claim 1, wherein the energy beam is an electron beam, an ion beam, or an electromagnetic radiation beam.

5. The method according to claim 1, wherein the energy beam is a focused electron beam.

6. The method according to claim 1, wherein the reflection layer is a multiple layer obtained by alternately laminating two different kinds of layers.

7. The method according to claim 1, wherein the reflection layer is a multiple layer obtained by alternately laminating a molybdenum layer and a silicon layer.

8. The method according to claim 1, wherein the reflection photo mask includes:
   a mask substrate on which the reflection layer is formed; and
   absorption patterns disposed on the reflection layer.

9. The method according to claim 8, wherein the reflection photo mask further includes:
   a capping layer interposed between the absorption patterns and the reflection layer; and
   a buffer layer interposed between the capping layer and the absorption patterns.

10. A method of correcting deviations of critical dimensions of patterns formed on a wafer in an extreme ultraviolet lithography process, the method comprising:
    preparing a reflection photo mask having a reflection layer and absorption patterns that are formed on the reflection layer to define reflection regions therebetween;
    forming the patterns on the wafer by performing an exposure process using the reflection photo mask;
    measuring critical dimensions of the patterns;
    setting a reference critical dimension based on the measured critical dimensions of the patterns;
    determining critical dimension deviations by comparing the measured critical dimensions of the patterns with the reference critical dimension; and
    locally varying the thickness of the reflection layer by locally irradiating an energy beam, which has an energy corresponding to the critical dimension deviations, onto the reflection layer.

11. The method according to claim 10, wherein locally varying the thickness of the reflection layer includes locally reducing the thickness of the reflection layer.

12. The method according to claim 11, wherein locally reducing the thickness of the reflection layer includes locally lowering the reflectance of the reflection layer.

13. The method according to claim 12, wherein when the measured critical dimensions of the patterns are critical dimensions of clear patterns transferred from the reflection regions, and the reference critical dimension is set to a minimum of the measured critical dimensions of the patterns.

14. The method according to claim 12, wherein when the measured critical dimensions of the patterns are critical dimensions of dark patterns transferred from the absorption patterns, and the reference critical dimension is set to a maximum of the measured critical dimensions of the patterns.

15. The method according to claim 10, wherein the energy beam is an electron beam, an ion beam, or an electromagnetic radiation beam.

16. The method according to claim 10, wherein the energy beam is a focused electron beam.

17. The method according to claim 10, wherein the reflection layer is a multiple layer obtained by alternately laminating two or more different kinds of layers.

18. The method according to claim 10, wherein the reflection layer is a multiple layer obtained by alternately laminating a molybdenum layer and a silicon layer.

19. The method according to claim 10, wherein the reflection photo mask further includes:
    a capping layer interposed between the absorption patterns and the reflection layer; and
    a buffer layer interposed between the capping layer and the absorption patterns.

20. A method of varying critical dimensions of patterns formed on a wafer, the method comprising:
    providing a reflection photo mask having a reflection layer; and
    locally modifying the reflection layer by locally irradiating an energy beam onto the reflection layer.

21. The method according to claim 20, wherein locally modifying the reflection layer includes locally changing the reflectance of the reflection layer.

22. The method according to claim 20, wherein locally modifying the reflection layer includes thermally activating a portion of the reflection layer.

* * * * *